United States Patent
Kim et al.

(10) Patent No.: US 11,614,869 B2
(45) Date of Patent: Mar. 28, 2023

(54) CONTROLLER FOR PREVENTING UNCORRECTABLE ERROR IN MEMORY DEVICE, MEMORY DEVICE HAVING THE SAME, AND OPERATING METHOD THEREOF

(71) Applicant: SAMSUNG ELECTRONICS CO., LTD., Suwon-si (KR)

(72) Inventors: Hoyoun Kim, Suwon-si (KR); Kijun Lee, Seoul (KR); Myungkyu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/226,606

(22) Filed: Apr. 9, 2021

(65) Prior Publication Data
US 2022/0100395 A1 Mar. 31, 2022

(30) Foreign Application Priority Data
Sep. 29, 2020 (KR) .................. 10-2020-0126747

(51) Int. Cl.
*G06F 3/06* (2006.01)
(52) U.S. Cl.
CPC .......... *G06F 3/0619* (2013.01); *G06F 3/0653* (2013.01); *G06F 3/0673* (2013.01)
(58) Field of Classification Search
None
See application file for complete search history.

(56) References Cited

U.S. PATENT DOCUMENTS

| | | | |
|---|---|---|---|
| 6,684,353 B1 | 1/2004 | Parker et al. | |
| 7,234,099 B2 | 6/2007 | Gower et al. | |
| 9,471,423 B1* | 10/2016 | Healy | ................. G06F 11/1048 |
| 9,697,905 B2 | 7/2017 | Sharon et al. | |
| 10,019,312 B2 | 7/2018 | Healy et al. | |
| 10,431,299 B2 | 10/2019 | Tokutomi et al. | |
| 2005/0022065 A1* | 1/2005 | Dixon | ................. G11C 29/848 714/42 |
| 2017/0060681 A1* | 3/2017 | Halbert | ................. G06F 3/0619 |
| 2017/0123882 A1 | 5/2017 | Healy et al. | |
| 2018/0189135 A1* | 7/2018 | Naik | ..................... G11C 29/028 |

FOREIGN PATENT DOCUMENTS

KR 10-1606040 B1 4/2016

\* cited by examiner

*Primary Examiner* — Sanjiv Shah
*Assistant Examiner* — Alexander J Yoon
(74) *Attorney, Agent, or Firm* — Sughrue Mion, PLLC

(57) ABSTRACT

A memory system is provided. The memory system includes at least one memory device, and a controller configured to control the at least one memory device, wherein the controller includes: an error correction circuit configured to correct an error in data read from the at least one memory device, a codeword error counter configured to obtain a syndrome of a current codeword error based on a codeword error occurring in the error correction circuit, and to obtain a weighted codeword error count value by comparing the obtained syndrome with a previous syndrome, and an alert device configured to generate a warning signal for preventing an uncorrectable error of the at least one memory device according to the weighted codeword error count value.

19 Claims, 11 Drawing Sheets

CONTROLLER FOR PREVENTING UNCORRECTABLE ERROR IN MEMORY DEVICE, MEMORY DEVICE HAVING THE SAME, AND OPERATING METHOD THEREOF

CROSS-REFERENCE TO THE RELATED APPLICATION

This application claims priority from Korean Patent Application No. 10-2020-0126747 filed on Sep. 29, 2020 in the Korean Intellectual Property Office, the disclosure of which is incorporated herein by reference in its entirety.

BACKGROUND

1. Field

Methods, apparatuses and systems consistent with example embodiments relate to a storage device, and a data disposal method thereof.

2. Related Art

Data errors may occur due to various environmental factors affecting reliability of dynamic random access memory (DRAM) cells. Many memory errors can still be corrected using error codes.

SUMMARY

Example embodiments provide a controller for preventing an uncorrectable error of a memory device, a memory system including the same, and an operating method thereof.

According to an aspect of an example embodiment, an operating method of a memory system having a memory device and a controller includes: obtaining a current syndrome corresponding to a codeword error that has occurred in the controller; determining the current syndrome contains a single bit with a value of one; determining the current syndrome does not correspond to a previous syndrome stored in a syndrome buffer, based on the current syndrome containing the single bit with the value of one; increasing a codeword error count value by an integer greater than one in the controller, based on the current syndrome not corresponding to the previous syndrome; determining the codeword error count value is greater than a reference value; and performing an operation for preventing an uncorrectable error of the memory device in the controller, based on the codeword error count value being greater than the reference value.

According to an aspect of an example embodiment, a memory system includes at least one memory device; and a controller configured to control the at least one memory device, wherein the controller includes: an error correction circuit configured to correct an error in data read from the at least one memory device; a codeword error counter configured to obtain a syndrome of a current codeword error, based on a codeword error occurring in the error correction circuit, and to obtain a weighted codeword error count value by comparing the obtained syndrome with a previous syndrome; and an alert device configured to generate a warning signal for preventing an uncorrectable error of the at least one memory device according to the weighted codeword error count value.

According to an aspect of an example embodiment, a controller includes: an error correction circuit configured to correct an error in data read from a memory device; a first error counter configured to provide a syndrome of a codeword error based on the codeword error occurring in the error correction circuit, and to compare the provided syndrome with a previous syndrome to generate a first error count value; a second error counter configured to compare an error address of the codeword error with a previously stored error address based on the codeword error occurring in the error correction circuit to generate a second error count value; a fault predictor configured to predict a type or location of the error according to the second error count value; and an alert device configured to output a warning signal to the memory device, based on the first error count value being greater than a reference value, and to output the warning signal according to an output of the fault predictor.

BRIEF DESCRIPTION OF DRAWINGS

The above and other aspects, features and advantages will become more apparent from the following description of example embodiments with reference to the accompanying drawings, in which.

DETAILED DESCRIPTION

Hereinafter, example embodiments will be described in detail with reference to the accompanying drawings.

Figure 1:
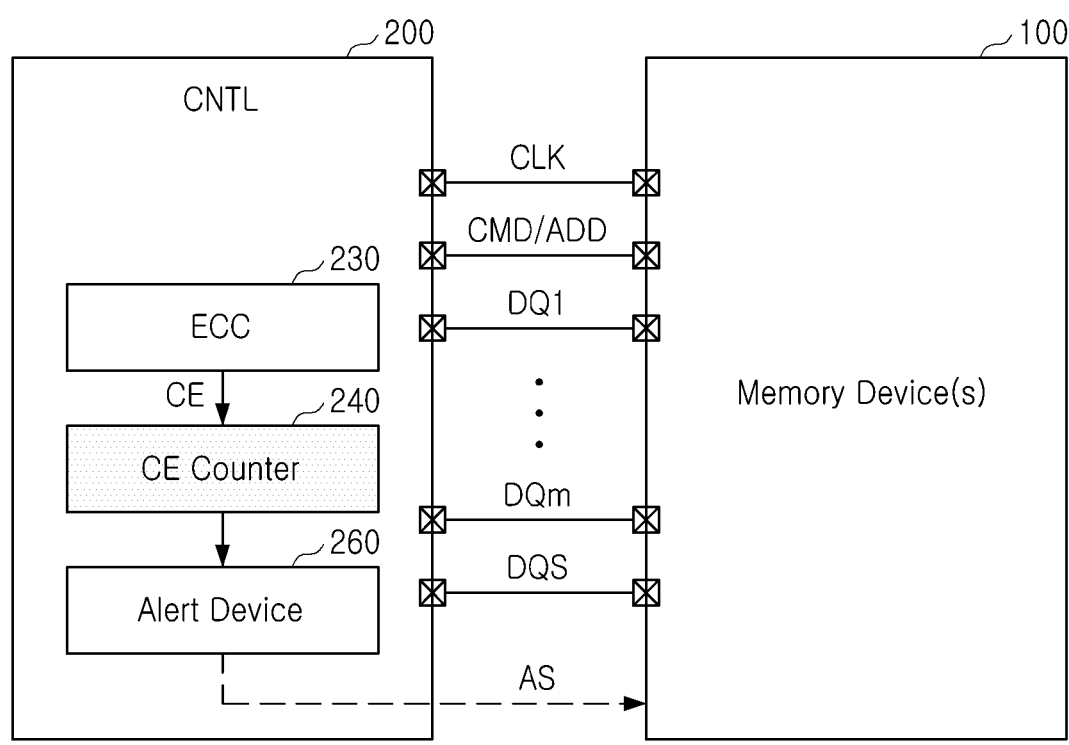
FIG. 1 is a diagram illustrating a memory system 10 according to an example embodiment.

FIG. 1 is a diagram illustrating a memory system 10 according to an example embodiment. Referring to FIG. 1, the memory system 10 may include at least one memory device 100 and a controller 200.

The memory device 100 may be implemented to temporarily store data processed or to be processed by the controller 200. The memory device 100 may be used as an operation memory, a working memory, or a buffer memory in a computing system. In an example embodiment, the memory device 100 may be implemented as a single in-line memory module (SIMM), a dual in-line memory module (DIMM), a small-outline DIMM (SODIMM), an unbuffered DIMM (UDIMM), a fully-buffered memory module DIMM (FBDIMM), a Rank-Buffered DIMM (RBDIMM), a mini-DIMM, a micro-DIMM, a registered DIMM (RDIMM), or a load-Reduced DIMM (RDIMM). In an example embodiment, the memory device 100 may input/output data through channels according to various standards such as Double Data Rate (DDR), DDR2, DDR3, DDR4, DDR5, DDRx, and the like. The memory device 100 may include a plurality of memory chips. Each of the plurality of memory chips may be implemented as a volatile or non-volatile memory.

The controller 200 may be implemented to transmit and receive a command/address (CMD/ADD), a clock (CLK), a control signal, data (DQ1 to DQm, m is an integer of 2 or more), a data strobe signal (DQS), and the like with the memory device 100 through a channel. The controller 200 may be implemented to read data from the memory device 100 and/or write data to the memory device 100.

In an example embodiment, the controller 200 may provide a command/address (CMD/ADD) and a control signal to the memory device 100, and control data DQ transmission/reception between memory chips of the memory device 100 to and from a memory chip to be accessed based on a control signal in a write or read operation corresponding to the command/address (CMD/ADD). In an example embodiment, the controller 200 may be connected to an external host such as a processor. For example, the controller 200 may communicate with an external host through at least one of various interface protocols such as a Universal Serial Bus (USB), a Multi Media Card (MMC), a Parallel Connection Interface (PCI), a Parallel Connection Interface Express (PCIe), an Advanced Technology Attachment (ATA), a Serial-ATA, a Parallel-ATA, a Small Computer System Interface (SCSI), a Serial Attached SCSI (SAS), an Enhanced Small Device Interface (ESDI), an Integrated Drive Electronics (IDE), and the like.

In an example embodiment, the controller 200 may be configured as a chip that is separate from the memory device 100 or may be integrated with the memory device 100. For example, the controller 200 may be implemented on a mother board, and may be implemented with an integrated memory controller (IMC) included in a microprocessor. In addition, the controller 200 may be located in an input/output hub, and an input/output hub including the controller 200 may be referred to as a memory controller hub (MCH).

In addition, the controller 200 may include an error correction circuit (ECC) 230, a codeword error counter 240, and an alert device 260.

The error correction circuit (ECC) 230 may be implemented to detect an error and correct the error. In an example embodiment, the error correction circuit 230 may use a parity check, a cyclic redundancy code check, a checksum check, and a hamming code. In an example embodiment, the error correction circuit 230 may use correction methods such as ×4 Single Device Data Correction (SDDC), ×8 Single-bit Error Correction and Double-bit Error Detection (SECDED), Lockstep ×8 SDDC, and the like, to correct errors of a plurality of memory chips.

In an example embodiment, the error correction circuit 230 may operate in any one of a first error correction mode and a second error correction mode. Here, the first error correction mode is a soft error correction mode, and the second error correction mode is a hard error correction mode. In an example embodiment, the error correction circuit 230 may determine whether error correction for data of the memory chip of the memory device 100 is possible in the first error correction mode, and if the error correction is possible, the error correction circuit 230 may perform a soft error correction operation. In an example embodiment, the error correction circuit 230 may perform a hard error correction operation on data of the memory chip in the second error correction mode when an error correction is possible but physical replacement (replacement of redundant cells) is required.

The codeword error counter 240 may be implemented to count a number of errors of a codeword generated in the operation of the error correction circuit 230. For example, the codeword error counter 240 may count the number of syndromes when a codeword error occurs, and may generate a codeword error count by giving a weight to the counted syndrome.

The alert device 260 may be implemented to generate a warning signal AS for the memory device 100 using a codeword error count. In response to the warning signal AS, the controller 200 may perform a subsequent operation such as sparing/page-offline/map-out/repair.

In an example embodiment, each of the error correction circuit 230, the codeword error counter 240, and the alert device 260 may be implemented as any one or any combination of software, hardware or firmware.

In general, when a codeword error occurs, the memory system increases the codeword count value by one, and determines that the probability of an uncorrectable error (UE) is high when the counted codeword count value is greater than or equal to a reference value. In this case, because a memory chip having a single-bit error is easily determined to have a high probability of occurrence of a UE, the associated redundant cost may increase.

On the other hand, the memory system 10 according to an example embodiment may perform a replacement of a memory chip by reflecting the comparison result to the codeword count by checking and comparing the syndrome when a codeword error occurs.

Accordingly, the memory system 10 can improve a capability for preventing an UE for a memory chip having a high-risk multi-bit error, and may reduce redundant costs of a memory chip having a low-risk single-bit error.

Figure 2:
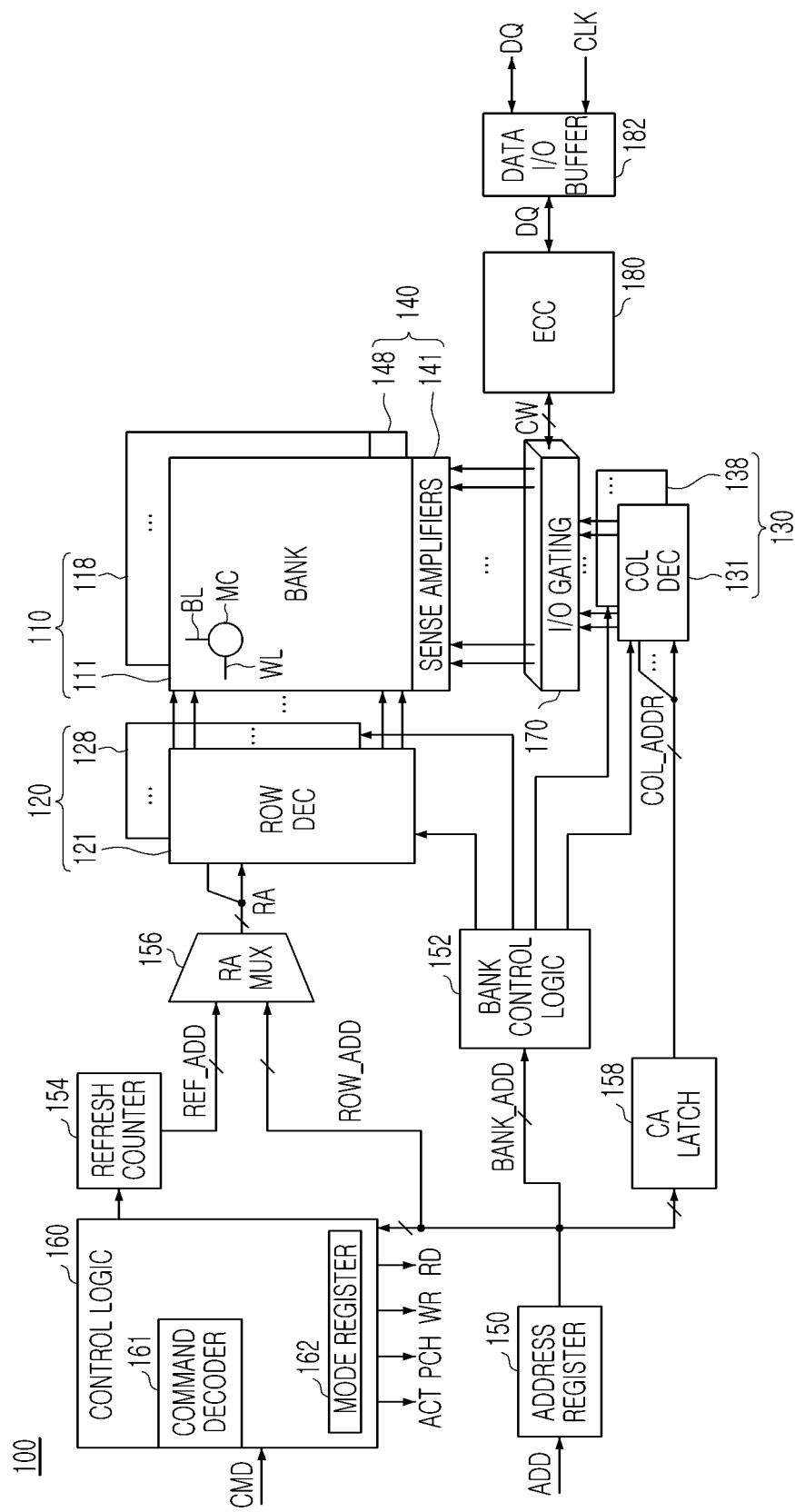
FIG. 2 is a diagram illustrating a memory chip of memory device 100 according to an example embodiment.

FIG. 2 is a diagram illustrating a memory chip of the memory device 100 according to an example embodiment.

Referring to FIG. 2, the memory device 100 may include a memory cell array 110, a row decoder 120, a column decoder 130, a sense amplifier circuit 140, an address register 150, a bank control logic 152, a refresh counter 154, a row address multiplexer 156, a column address latch 158, a control logic 160, a repair control circuit 166, a timing control circuit 164, an input/output gating circuit 170, an error correction circuit 180, a data input/output buffer 182, and a PBT circuit 190.

The memory cell array 110 may include first to eighth banks 111 to 118. It should be understood that the number of banks of the memory cell array 110 is not limited thereto. The row decoder 120 may include first to eighth bank row decoders 121 to 128 respectively connected to the first to eighth banks 111 to 118. The column decoder 130 may include first to eighth bank column decoders 131 to 138 respectively connected to the first to eighth banks 111 to 118. The sense amplifier circuit 140 may include first to eighth bank sense amplifiers 141 to 148 respectively connected to the first to eighth banks 111 to 118.

The first to eighth banks 111 to 118, the first to eighth bank row decoders 121 to 128, the first to eighth bank column decoders 131 to 138, and the first to eighth bank sense amplifiers 141 to 148 may constitute first to eighth banks, respectively. Each of the first to eighth banks 111 to 118 may include a plurality of memory cells MC formed at a point where the word lines WL and the bit lines BL cross each other.

The address register 150 may receive and store an address ADD having a bank address BANK_ADDR, a row address ROW_ADDR, and a column address COL_ADDR from an external memory controller. The address register 150 may provide the received bank address BANK_ADDR to the bank control logic 152, provide the received row address ROW_ADDR to the row address multiplexer 156, and provide the received column address COL_ADDR to the column address latch 158.

The bank control logic 152 may generate bank control signals in response to the bank address BANK_ADDR. In response to the bank control signals, a bank row decoder corresponding to the bank address BANK_ADDR among the first to eighth bank row decoders 121 to 128 may be activated. In response to the bank control signals, a bank column decoder corresponding to the bank address BANK_ADDR among the first to eighth bank column decoders 131 to 138 may be activated.

The row address multiplexer 156 may receive a row address ROW_ADDR from the address register 150, and may receive a refresh row address REF_ADDR from the refresh counter 154. The row address multiplexer 156 may selectively output the row address ROW_ADDR or the refresh row address REF_ADDR as a row address RA. The row address RA output from the row address multiplexer 156 may be applied to the first to eighth bank row decoders 121 to 128, respectively.

Among the first to eighth bank row decoders 121 to 128, the bank row decoder activated by the bank control logic 152 may decode the row address RA output from the row address multiplexer 156 to activate a word line corresponding to the row address. For example the activated bank row decoder may apply a word line driving voltage to a word line corresponding to a row address. In addition, the activated bank row decoder may activate the word line corresponding to the row address and simultaneously activate a redundancy word line corresponding to a redundancy row address output from the repair control circuit 166.

The column address latch 158 may receive a column address COL_ADDR from the address register 150, and temporarily store the received column address COL_ADDR. In addition, the column address latch 158 may gradually increase the received column address COL_ADDR in a burst mode. The column address latch 158 may apply the temporarily stored or gradually increased column address COL_ADDR to the first to eighth bank column decoders 131 to 138, respectively.

Among the first to eighth bank column decoders 131 to 138, the bank column decoder activated by the bank control logic 152 may activate a sense amplifier corresponding to the bank address BANK_ADDR and the column address COL_ADDR through the input/output gating circuit 170. In addition, the activated bank column decoder may perform a column repair operation in response to a column repair signal CRP output from the repair control circuit 166.

The control logic 160 may be implemented to control the operation of the memory device 100. For example, the control logic 160 may generate control signals so that the semiconductor memory device 100 performs a write operation and/or a read operation. The control logic 160 may include a command decoder 161 for decoding a command CMD received from the memory controller and a mode register set 162 for setting an operation mode of the memory device 100.

For example, the command decoder 161 may generate operation control signals ACT, PCH, WE, and RD corresponding to a command CMD by decoding a write enable signal (/WE), a row address strobe signal (/RAS), a column address strobe signal (/CAS), a chip select signal (/CS), and the like. The control logic 160 may provide the operation control signals ACT, PCH, WE, and RD to the timing control circuit 164. The control signals ACT, PCH, WR, and RD may include an active signal ACT, a precharge signal PCH, a write signal WR, and a read signal RD.

The timing control circuit 164 may generate first control signals CTL1 controlling a voltage level of the word line WL in response to the operation control signals ACT, PCH, WR, and RD and second control signals CTL2 controlling a voltage level of the bit line BL, and provide the first control signals CTL1 and the second control signals CTL2 to the memory cell array 110.

The repair control circuit 166 may generate repair control signals controlling a repair operation of a first cell region and a second cell region of at least one of banks based on the row address (ROW_ADDR), and the column address (COL_ADDR) of the address ADD (or an access address), and fuse information of each of the word lines. The repair control circuit 166 may provide a redundancy row address to the corresponding bank row decoder, provide a column repair signal to the corresponding bank column decoder, and provide a selection signal and an enable signal to a block control signal related to a redundancy array block.

In addition, the repair control circuit 166 may generate a hard post package repair (hPPR) word line activation signal in response to the address ADD in a hPPR mode stored in a mode register set 163. In addition, in a Soft Post Package Repair (sPPR) mode stored in the mode register set 163, the repair control circuit 166 may generate a sPPR word line activation signal in response to the address ADD.

In addition, in a sPPR OFF mode stored in the mode register set 163, the repair control circuit 166 may turn off a sPPR logic, and generate a normal word line activation signal to access previous data. In an example embodiment, the repair control circuit 166 may change a repair unit based on the address ADD and fuse information. For example, the repair control circuit 166 may change the type and number of repair address bits for address ADD and fuse information.

Each of the input/output gating circuits of the input/output gating circuit 170 may include an input data mask logic, read data latches for storing data output from the first to eighth banks 111 to 118, and write drivers for writing data to the first to eighth banks 111 to 118, together with circuits for gating input/output data.

A codeword CW to be read from one of the first to eighth banks 111 to 118 may be sensed by a sense amplifier corresponding to one bank, and may be stored in the read data latches. The codeword CW stored in the read data latches may be provided to a memory controller through the data input/output buffer 182, after ECC decoding is performed by the error correction circuit 180. Data DQ to be written to one of the first to eighth banks 111 to 118 may be written to one bank through write drivers after ECC encoding is performed by the error correction circuit 180.

The data input/output buffer 182 may provide data DQ to the error correction circuit 180 based on the clock signal CLK provided from the memory controller in a write operation, and may provide data DQ provided from the error correction circuit 180 in a read operation to the memory controller.

The error correction circuit 180 may generate parity bits based on the data bits of the data DQ provided from the data input/output buffer 182 in a write operation, and may provide a codeword CW including data DQ and the parity bits to an input/output gating circuit 170, and the input/ output gating circuit 170 can write the codeword CW to the bank. In addition, the error correction circuit 180 may receive the codeword CW read from one bank from the input/output gating circuit 170 in a read operation. The error correction circuit 180 may correct at least one error bit included in the data DQ by performing ECC decoding on the data DQ using parity bits included in the read codeword CW, and provide it to the data input/output buffer 182.

In addition, the memory device 100 according to an example embodiment may be implemented to receive a warning signal PS from a controller 200 (see FIG. 1), and to perform a repair operation for a row line/column line/bank in response to the warning signal PS. The memory device 100 may also itself perform a related repair operation by including the codeword error counter of FIG. 1.

Figure 3A:
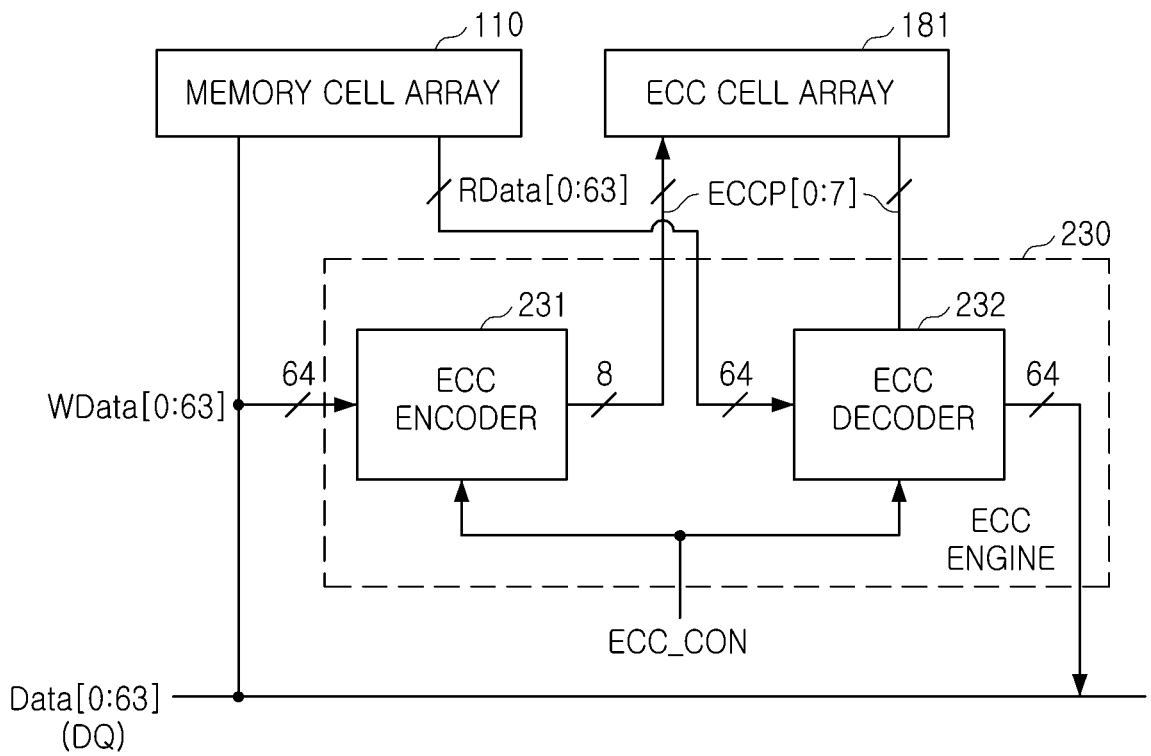
FIGS. 3A, 3B, and 3C are diagrams illustrating error correction circuit 230 of controller 200 according to an example embodiment.
Figure 3B:
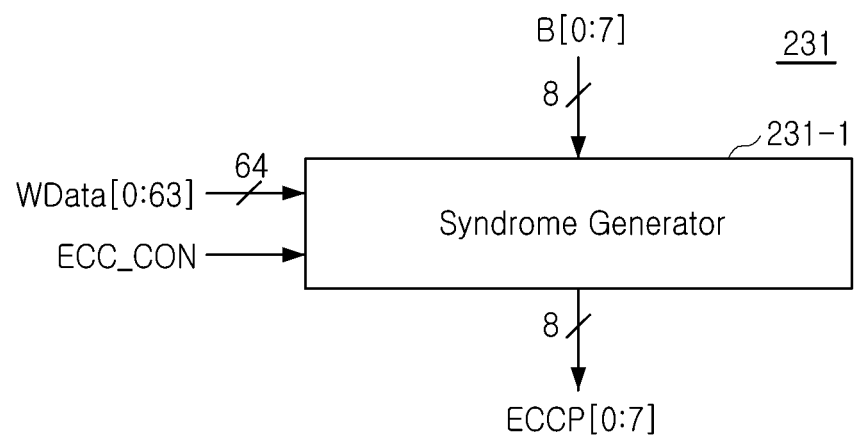
Figure 3C:
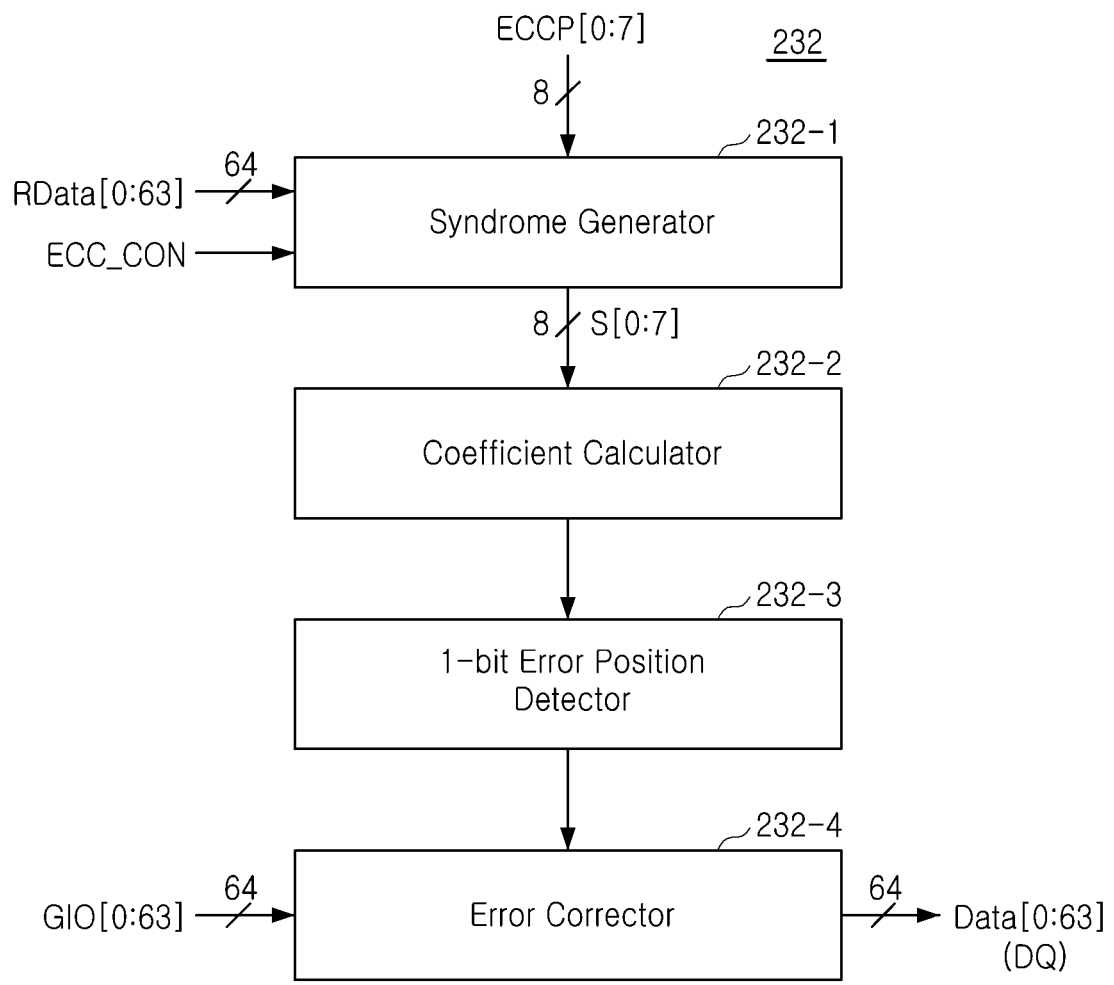

FIGS. 3A, 3B, and 3C are views illustrating an error correction circuit 230 of the controller 200 according to an example embodiment.

Referring to FIG. 3A, the error correction circuit 230 may include an ECC encoding circuit 231 and an ECC decoding circuit 232.

The ECC encoding circuit 231 may generate parity bits (ECCP[0:7]) for data (WData[0:63]) to be written to memory cells of the memory cell array 111 in response to an ECC control signal ECC_CON. The parity bits ECCP[0:7] may be stored in an ECC cell array 181.

In an example embodiment, the ECC encoding circuit 231 may generate parity bits (ECCP[0:7]) for data (WData[0:63]) to be written to memory cells including bad cells in response to the ECC control signal (ECC_CON).

The ECC decoding circuit 232 may correct error bit data using data (RData[0:63]) read from the memory cells of the memory cell array 111 and parity bits (ECCP) read from the ECC cell array 181 in response to the ECC control signal (ECC_CON), and may output the error corrected data (Data[0:63]).

In an example embodiment, the ECC decoding circuit 232 may correct error bit data using data (RData[0:63]) read from memory cells including bad cells and parity bits (ECCP[0:7]) read from the ECC cell array 181 in response to the ECC control signal (ECC_CON), and may output the error corrected data (Data[0:63]).

Referring to FIG. 3B, the ECC encoding circuit 231 may receive 64-bit write data (WData[0:63]) and basis bits (Basis Bit, B[0:7]) in response to an ECC control signal (ECC_CON), may include a syndrome generator 231-1 generating parity bits (ECCP[0:7]), that is, a syndrome using a XOR array operation.

The basis bits (B[0:7]) are bits for generating parity bits (ECCP[0:7]) for 64-bit write data (WData[0:63]), and may be composed of for example, b'00000000 bits. The basis bit (B[0:7]) may use other specific bits instead of b'00000000 bits.

Referring to FIG. 3C, the ECC decoding circuit 232 includes a syndrome generator 232-1, a coefficient calculator 232-2, a 1-bit error position detector 232-3, and an error corrector 232-4.

The syndrome generator 232-1 may receive 64-bit read data and 8-bit parity bits (ECCP[0:7]) in response to the ECC control signal (ECC_CON), and generate syndrome data (S[0:7]) using an XOR array operation.

The coefficient calculator 232-2 may calculate a coefficient of an error position equation using the syndrome data S[0:7]. Here, the error position equation is an equation based on a reciprocal of an error bit.

The 1-bit error position detector 232-3 may calculate a 1-bit error position using the calculated error position equation.

The error corrector 232-4 may determine the 1-bit error position based on a detection result of the 1-bit error position detector 232-3.

The error corrector 232-4 may correct an error by inverting a logic value of a bit in which an error occurred among 64-bit read data (RData[0:63]) according to the determined 1-bit error position information, and may output the error corrected 64-bit data (Data[0:63]).

The controller 200 according to an example embodiment may include a syndrome buffer storing a syndrome, so that a weighted codeword count can be performed.

Figure 4:
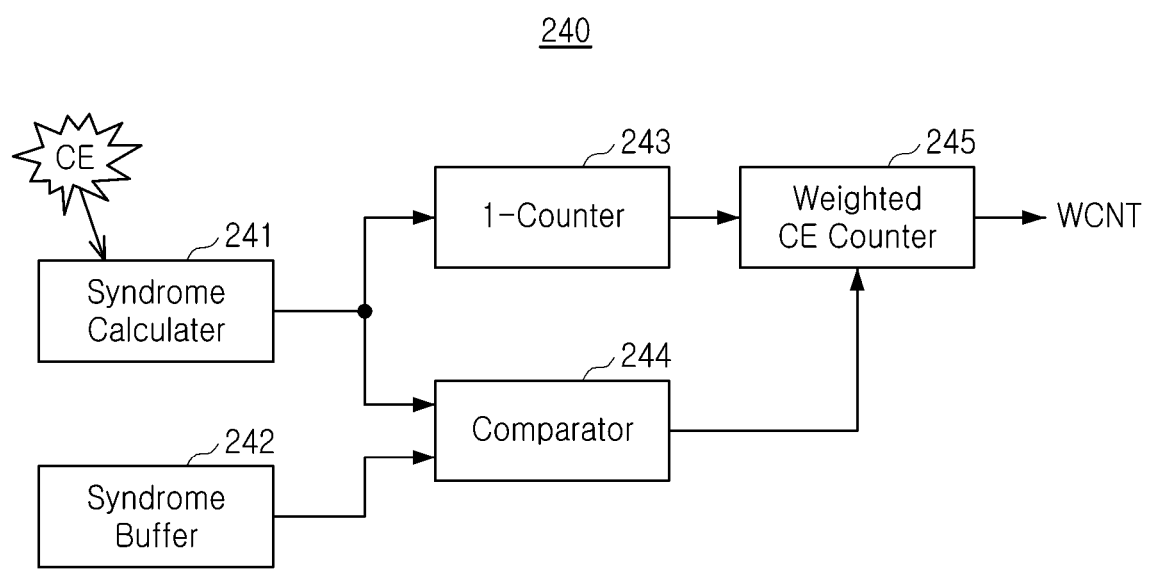
FIG. 4 is a diagram illustrating a codeword error counter 240 according to an example embodiment.

FIG. 4 is a diagram illustrating a codeword error counter 240 according to an example embodiment.

Referring to FIG. 4, the codeword error counter 240 may include a syndrome calculator 241, a syndrome buffer 242, a bit counter 243, a comparator 244, and a weighted codeword error (CE) counter 245.

The syndrome calculator 241 may be implemented to calculate a first syndrome when a codeword error (CE) occurs. The syndrome buffer 242 may be implemented to store a second syndrome of the previous ECC operation.

The bit counter 243 may generate a first count value in response to a syndrome output of the syndrome calculator 241.

The comparator 244 may be implemented to compare the first syndrome of the syndrome calculator 241 with the second syndrome of the syndrome buffer 242.

The weighted CE counter 245 may be implemented to generate a weighted codeword error count value WCNT, at a predetermined ratio according to whether the first syndrome and the second syndrome exist. In an example embodiment, if the first syndrome and the second syndrome are the same, because the probability of a single bit error is high, the codeword error count value WCNT may increase by only one count value.

In another example embodiment, if the first syndrome and the second syndrome are not the same, a weighted count value may be reflected in the codeword error count value WCNT because the probability of a multi-bit error is high.

Figure 5:
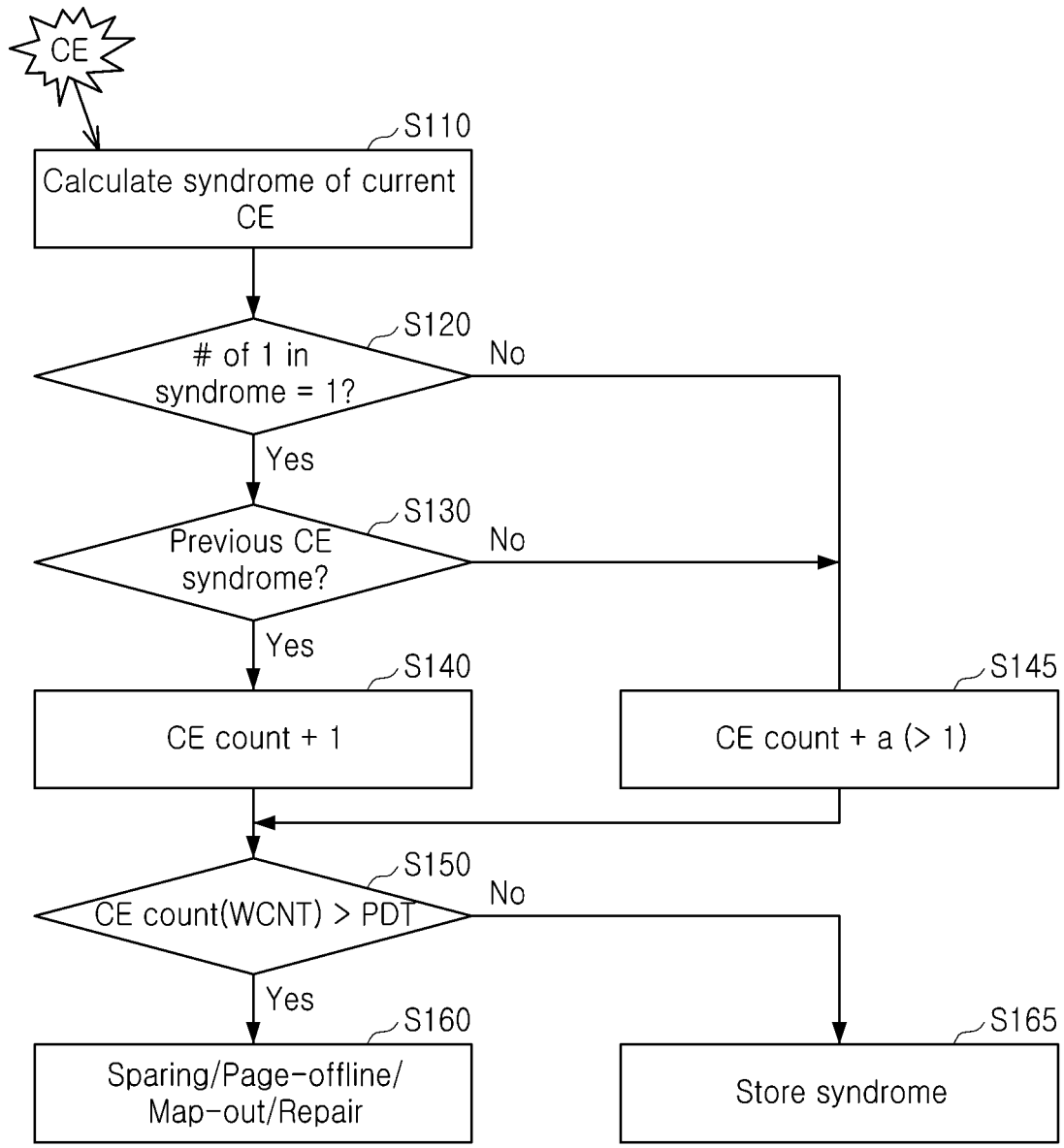
FIG. 5 is a flowchart illustrating an operating method of a memory system according to an example embodiment.

FIG. 5 is a flowchart illustrating an operating method of a memory system according to an example embodiment.

Referring to FIGS. 1 to 5, a controller 200 of a memory system 10 may perform a UE prevention operation as follows.

When a codeword error CE occurs in the error correction circuit 230, a syndrome may be calculated for a current codeword error (S110). In the calculated syndrome, it may be determined whether the number of 1s is 1 (S120). If the number of 1s in the calculated syndrome is 1, it may be determined whether the current syndrome is the same as the previous syndrome stored in the syndrome buffer (S130).

Here, if the current syndrome is the same as the previous syndrome, there is a high probability of a single bit error. Accordingly, the codeword error count value WCNT may be increased by 1 (S240).

On the other hand, if the number of 1s in the syndrome in step S120 is not 1, or if the current syndrome and the previous syndrome in step S130 are not the same, the codeword error count value WCNT may be increased by a weighted count value a, which is an integer that is greater than 1 (S245).

Thereafter, it may be determined whether the codeword error count value WCNT is greater than a reference value PDT (S150). If the codeword error count value WCNT is greater than the reference value PDT, a warning signal AS for UE prevention of the memory device 100 may be generated.

A Sparing/Page-offline/Map-out/Repair operations may be performed in response to the warning signal AS (S160). On the other hand, if the codeword error count value WCNT is not greater than the reference value PDT, the current syndrome may be stored in the syndrome buffer (S165).

The memory system according to an example embodiment may store a chip/row/column address in which a codeword error (CE) occurs when a codeword error (CE) occurs, and can predict a fault type based on the address information.

Figure 6:
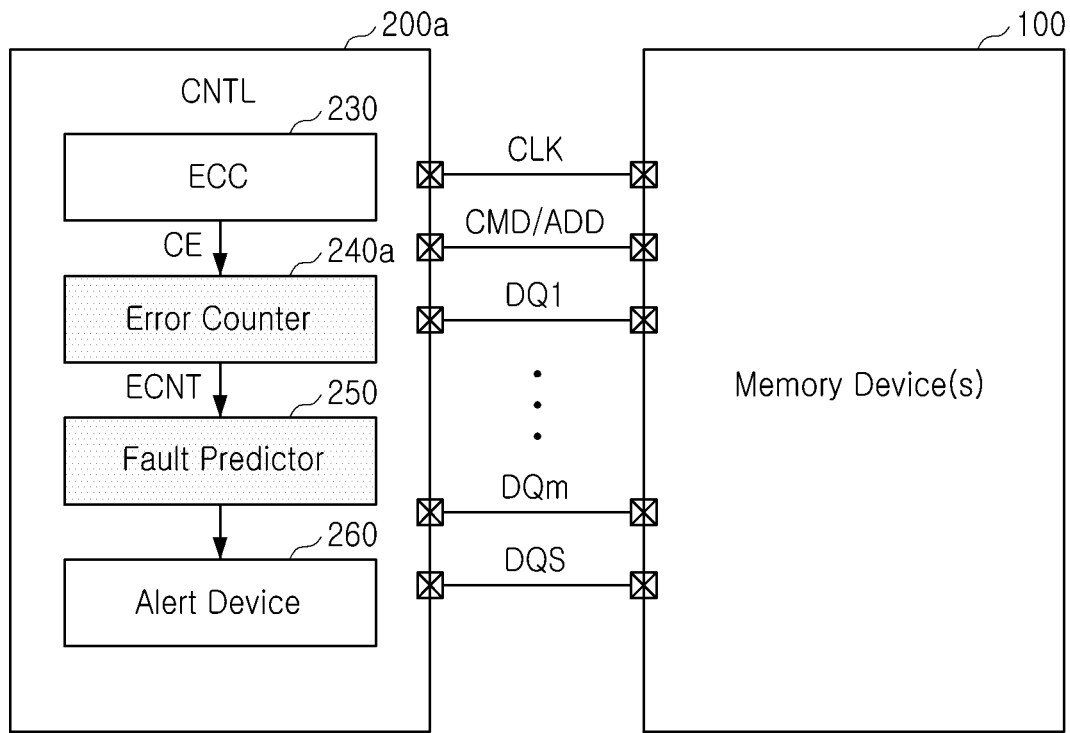
FIG. 6 is a diagram illustrating a memory system 20 according to another example embodiment.

FIG. 6 is a diagram illustrating a memory system 20 according to another example embodiment.

Referring to FIG. 6, the memory system 20 may include a memory device 100 and a controller 200*a*.

The controller 200*a* may include an error correction circuit 230, an error counter 240*a*, a fault predictor 250, and an alert device 260.

The error counter 240*a* may be implemented to generate a corresponding error count value ECNT by comparing the chip/row/column address where the codeword error CE has occurred with previously stored address information when a codeword error CE occurs.

The fault predictor 250 may be implemented to predict the type or a location of an error using the generated error count value ECNT.

The alert device 260 may be implemented to generate a warning signal AS to a corresponding memory chip of the memory device 100 based on the type or location information of an error from the fault predictor 250.

Figure 7:
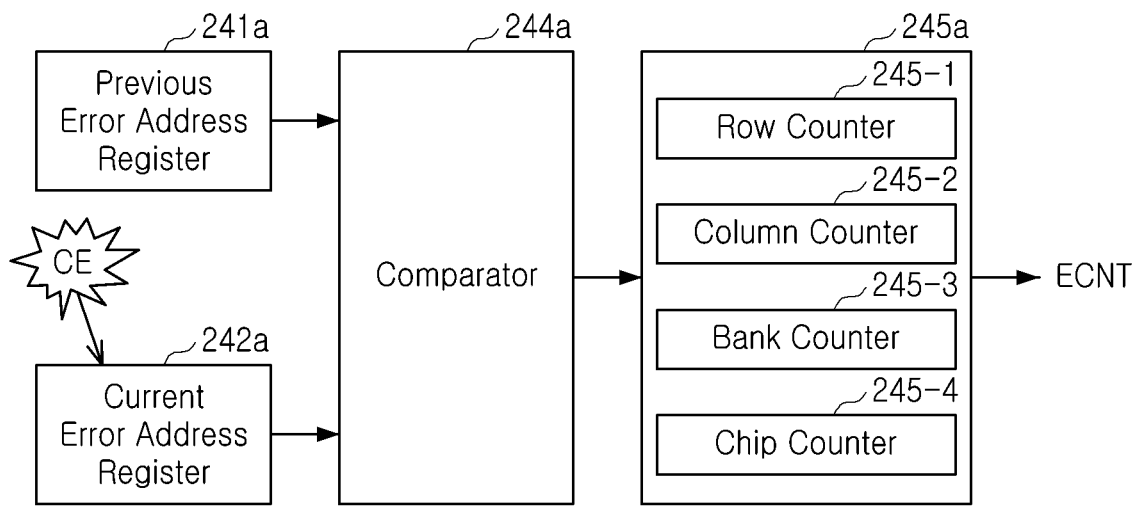
FIG. 7 is a diagram illustrating an error counter 240a according to an example embodiment.

FIG. 7 is a diagram illustrating an error counter 240*a* according to an example embodiment.

Referring to FIG. 7, the error counter 240*a* may include a previous error address register 241*a*, a current error address register 242*a*, a comparator 244*a*, and a counter 245*a*. The error counter 240*a* may be implemented to count the number of different row/column/bank/chip addresses in the physical address where the error occurs.

The previous error address register 241*a* may be implemented to store an error address stored when a previous codeword error occurs. The current error address register 242*a* may be implemented to store a corresponding error address when a current codeword error CE occurs.

The comparator 244*a* may be implemented to compare the error address stored in the previous error address register 241*a* with the error address stored in the current error address register 242*a*.

The counter 245*a* may include a row counter 245-1, a column counter 245-2, a bank counter 245-3, and a chip counter 245-4.

The row counter 245-1 may be implemented to increase an error count value ECNT by 1 for a row address having the same previous error address and current error address as a result of comparison of the comparator 244*a*.

The column counter 245-2 may be implemented to increase the error count value ECNT by 1 for a column address in which the previous error address and the current error address are the same as a result of comparison of the comparator 244*a*.

The bank counter 245-3 may be implemented to increase the error count value ECNT by 1 for a bank address in which the previous error address and the current error address are the same as a result of comparison of the comparator 244*a*.

The chip counter 245-4 may be implemented to increase the error count value ECNT by 1 for chip addresses having the same previous error address and current error address as a result of comparison of the comparator 244*a*.

The fault predictor 250 may be implemented to receive the error count value ECNT and predict the type or location of the error.

In an example embodiment, when the count value of the row counter 245-1 is greater than 1, the fault predictor 250 may determine the count value as a row error.

In an example embodiment, when the count value of the column counter 245-2 is greater than 1, the fault predictor 250 may determine the count value as a column error.

In an example embodiment, when only the count value of the row counter 245-1 and the count value of the column counter 245-2 are both greater than 1, the fault predictor 250 may determine the count value as a single bank error.

In an example embodiment, when the count value of the bank counter 245-3 is greater than 1, the fault predictor 250 may determine the count value as a multi-bank error. An error count for a bank group may also be performed.

In an example embodiment, when the count value of the chip counter 245-4 is greater than 1, the fault predictor 250 may determine the count value as a multi-chip error. In an example embodiment, a chip count value may be implemented using DQ information.

Figure 8:
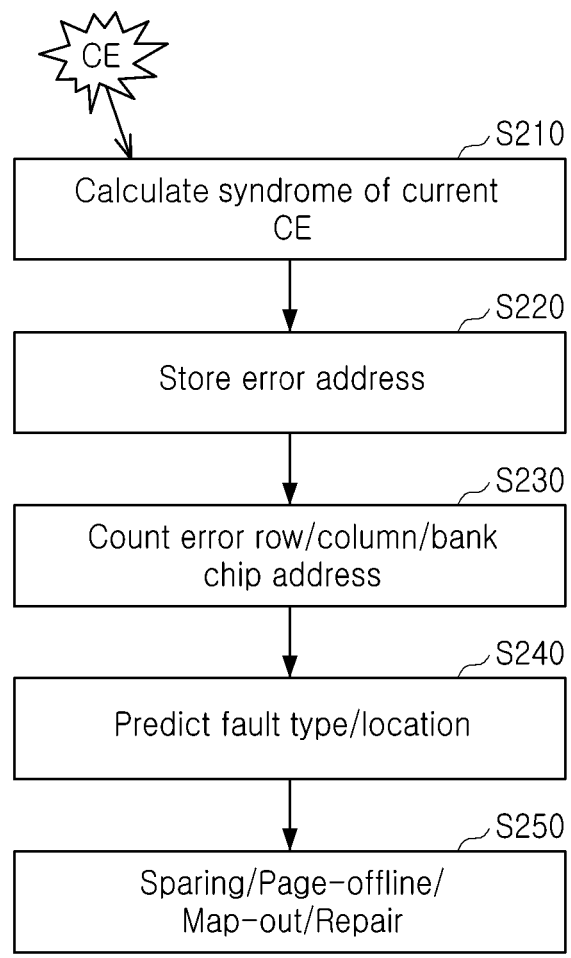
FIG. 8 is a flowchart illustrating an operating method of the memory system 20 according to an example embodiment.

FIG. 8 is a flowchart illustrating an operating method of the memory system 20 according to an example embodiment.

Referring to FIGS. 6 to 8, the controller 200*a* of the memory system 20 may operate to prevent UE prevention of the memory device 100 as follows.

When a codeword error (CE) occurs, a syndrome of a current codeword error may be calculated (S210).

An error address in which the syndrome will occur may be stored in a second address register 242*a* (S220).

A first error address stored in the first address register 241*a* and the second error address stored in the second error address register 242*a* may be compared, and if the first error address and the second error address are the same, the associated error row/column/bank/chip address can be counted (S230).

The type or location of the error may be predicted according to an error count value ECNT of the row/column/bank/chip address (S240).

Thereafter, the controller 200*a* may perform a sparing/page-offline/map-out/repair operation on the memory device 100 based on the type or location information of the error to prevent the UE.

The weighted codeword error count operation described in FIGS. 1 to 5 and the error address count operation described in FIGS. 6 to 8 may be performed simultaneously.

Figure 9:
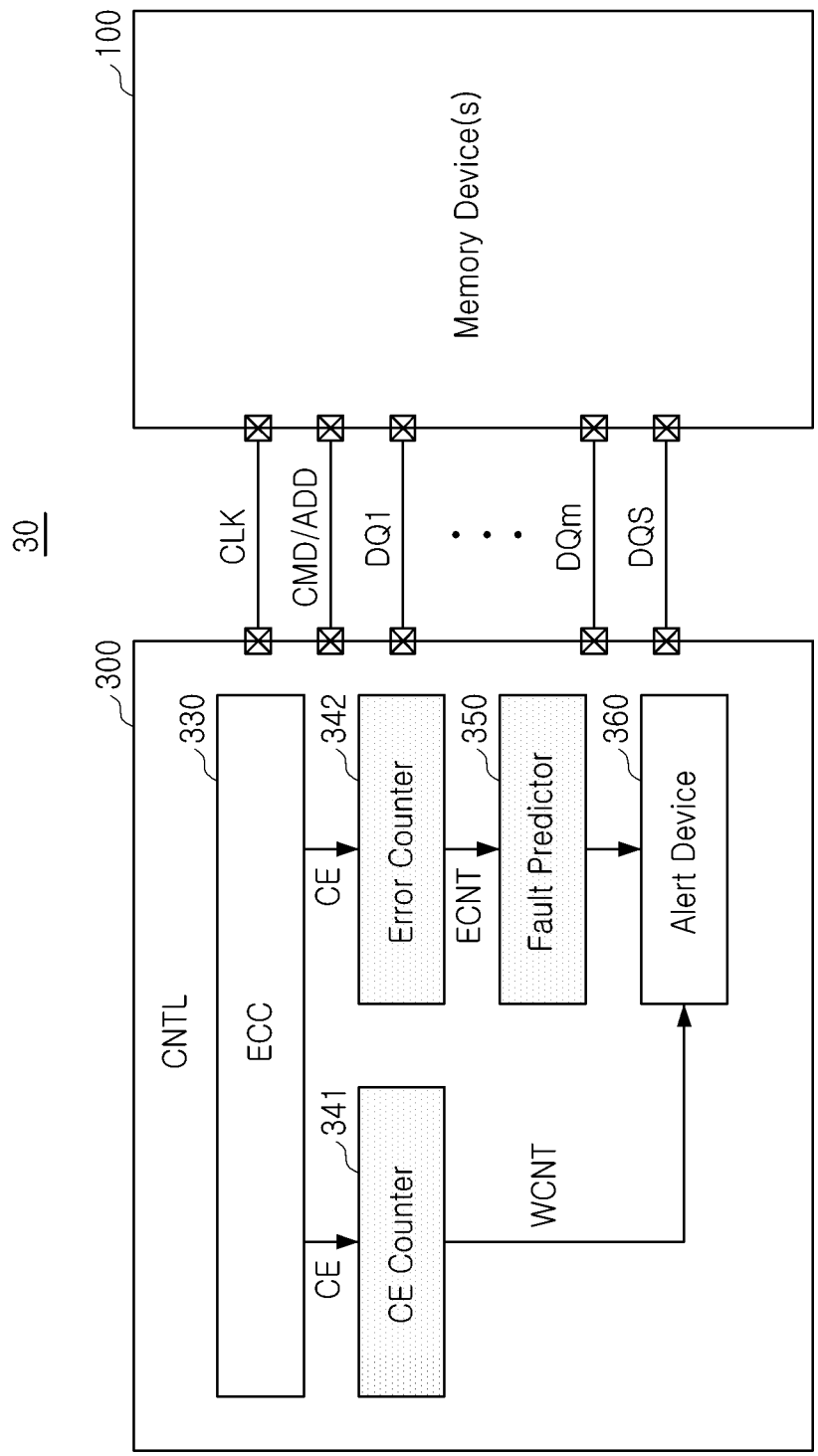
FIG. 9 is a diagram illustrating a data server system 30 according to an example embodiment.

FIG. 9 is a diagram illustrating a memory system 30 according to another example embodiment.

Referring to FIG. 9, the memory system 30 has a difference between the controller 300 and those of FIGS. 1 and 6.

The controller 300 may include an error correction circuit 330, a first error counter 341, a second error counter 342, a fault predictor 350, and an alert device 360.

The first error counter 341 may be implemented in the same manner as the codeword error counter 240 shown in FIG. 1, and the second error counter 342 may be implemented in the same manner as the error counter 240*a* shown in FIG. 6.

Example embodiments can be applied to a computing system.

Figure 10:
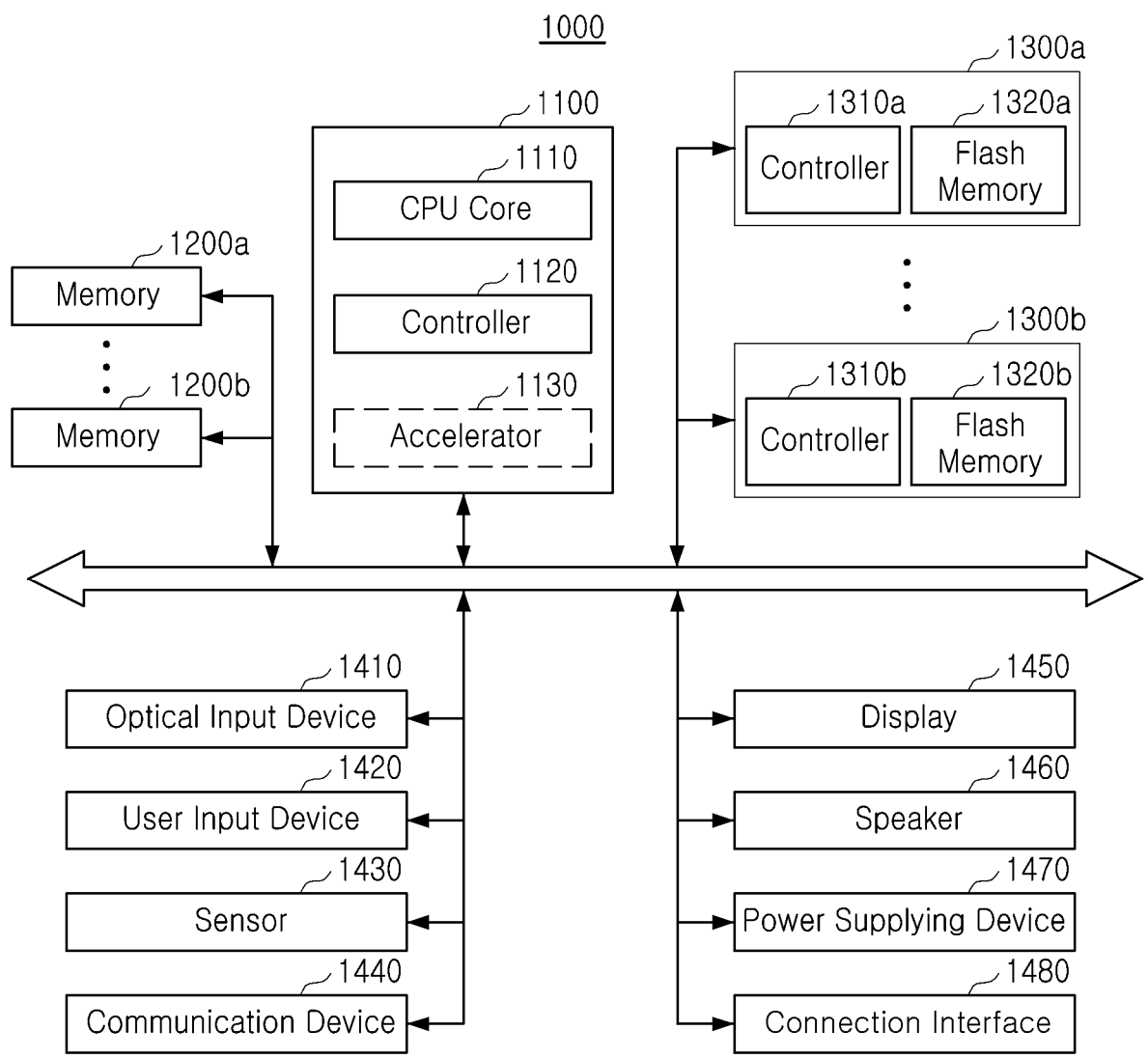
FIG. 10 is a diagram illustrating a computing system 1000 according to an example embodiment.

FIG. 10 is a diagram illustrating a computing system 1000 according to an example embodiment.

The computing system 1000 of FIG. 10 may be a mobile system, such as a portable communication terminal (a mobile phone), a smart phone, a tablet personal computer (PC), a wearable device, a healthcare device, or an Internet of things (IoT) device. However, the system 1000 of FIG. 10 is not necessarily limited to a mobile system, and may be a personal computer, a laptop computer, a server, a media player, or an automotive device such as a navigation system, or the like.

Referring to FIG. 10, the system 1000 may include a main processor 1100, memories 1200a and 1200b, and storage devices 1300a and 1300b, and additionally, may include one or more of an optical input device 1410, a user input device 1420, a sensor 1430, a communication device 1440, a display 1450, a speaker 1460, a power supplying device 1470, and a connection interface 1480.

The main processor 1100 may control an overall operation of the system 1000, more specifically, operations of other components constituting the system 1000. The main processor 1100 may be implemented as a general-purpose processor, a dedicated processor, an application processor, or the like.

The main processor 1100 may include one or more CPU cores 1110, and may further include a controller 1120 for controlling the memories 1200a and 1200b and/or the storage devices 1300a and 1300b. In an example embodiment, the main processor 1100 may further include an accelerator block 1130, which is a dedicated circuit for a high-speed data operation such as an artificial intelligence (AI) data operation, or the like.

Such an accelerator block 1130 may include a graphics processing unit (GPU), a neural processing unit (NPU), and/or a data processing unit (DPU), and may also be implemented as a separate chip physically independent from other components of the main processor 1100. In particular, the main processor 1100 may be implemented to generate a weighted syndrome error count value (WCNT) or an error count value (ECNT) of row/column/bank/chip addresses as described in FIGS. 1 to 8, and to prevent UE of the memory devices 1200a and 1200b using the weighted syndrome error count value WCNT or the error count value ECNT of row/column/bank/chip address.

The memories 1200a and 1200b may be used as main memory devices of the system 1000, and may include volatile memories such as SRAM and/or DRAM, but may include non-volatile memories such as a flash memory, a PRAM and/or RRAM. The memories 1200a and 1200b may also be implemented in the same package as the main processor 1100.

The storage devices 1300a and 1300b may function as non-volatile storage devices storing data regardless of whether power is supplied or not, and may have a relatively larger storage capacity than the memories 1200a and 1200b. The storage devices 1300a and 1300b may include storage controllers 1310a and 1310b and non-volatile memory (NVM) storages 1320a and 1320b storing data under the control of the storage controllers 1310a and 1310b. The non-volatile memories 1320a and 1320b may include a V-NAND flash memory having a 2D (2-dimensional) structure or a 3D (7-dimensional) structure, but may also include other types of non-volatile memories such as a PRAM and/or a RRAM.

The storage devices 1300a and 1300b may be included in the system 1000 while being physically separated from the main processor 1100, or may be implemented in the same package as the main processor 1100. In addition, the storage devices 1300a and 1300b have a shape such as a solid state device (SSD) or a memory card, and thus may be coupled to be detachable to other components of the system 1000 through an interface such as a connection interface 2480 to be described later. Such storage devices 1300a and 1300b may be devices to which standard conventions such as universal flash storage (UFS), embedded multi-media card (eMMC), or non-volatile memory express (NVMe) are applied, but are necessarily limited thereto.

The optical input device 1410 may capture a still image or a video, and may be a camera, a camcorder, and/or a webcam.

The user input device 1420 may receive various types of data input from the user of the system 1000, and may include a touch pad, a keypad, a keyboard, a mouse, and/or a microphone, or the like.

The sensor 1430 may detect various types of physical quantities that can be obtained from outside the system 1000 and convert the detected physical quantities into electrical signals. Such a sensor 1430 may be a temperature sensor, a pressure sensor, an luminance sensor, a position sensor, an acceleration sensor, a biosensor, and/or a gyroscope.

The communication device 1440 may transmit and receive signals with other devices outside the system 1000 according to various communication protocols. The communication device 2440 may be implemented to include an antenna, a transceiver, and/or a modem (MODEM).

The display 1450 and the speaker 1460 may function as output devices outputting visual information and audio information to a user of the system 1000, respectively.

The power supply device 1470 may appropriately convert power supplied from inside the system 1000 (i.e., from a battery), and/or power supplied from an external power source, and supply the power to each component of the system 1000.

The connection interface 1480 may provide a connection between the system 1000 and an external device that is connected to the system 1000 and capable of exchanging data with the system 1000. The connection interface 1480 may be realized by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (e-MMC), universal flash storage (UFS), embedded universal flash storage (eUFS), compact flash (CF) card interface.

Example embodiments may be applicable to a data server system.

Figure 11:
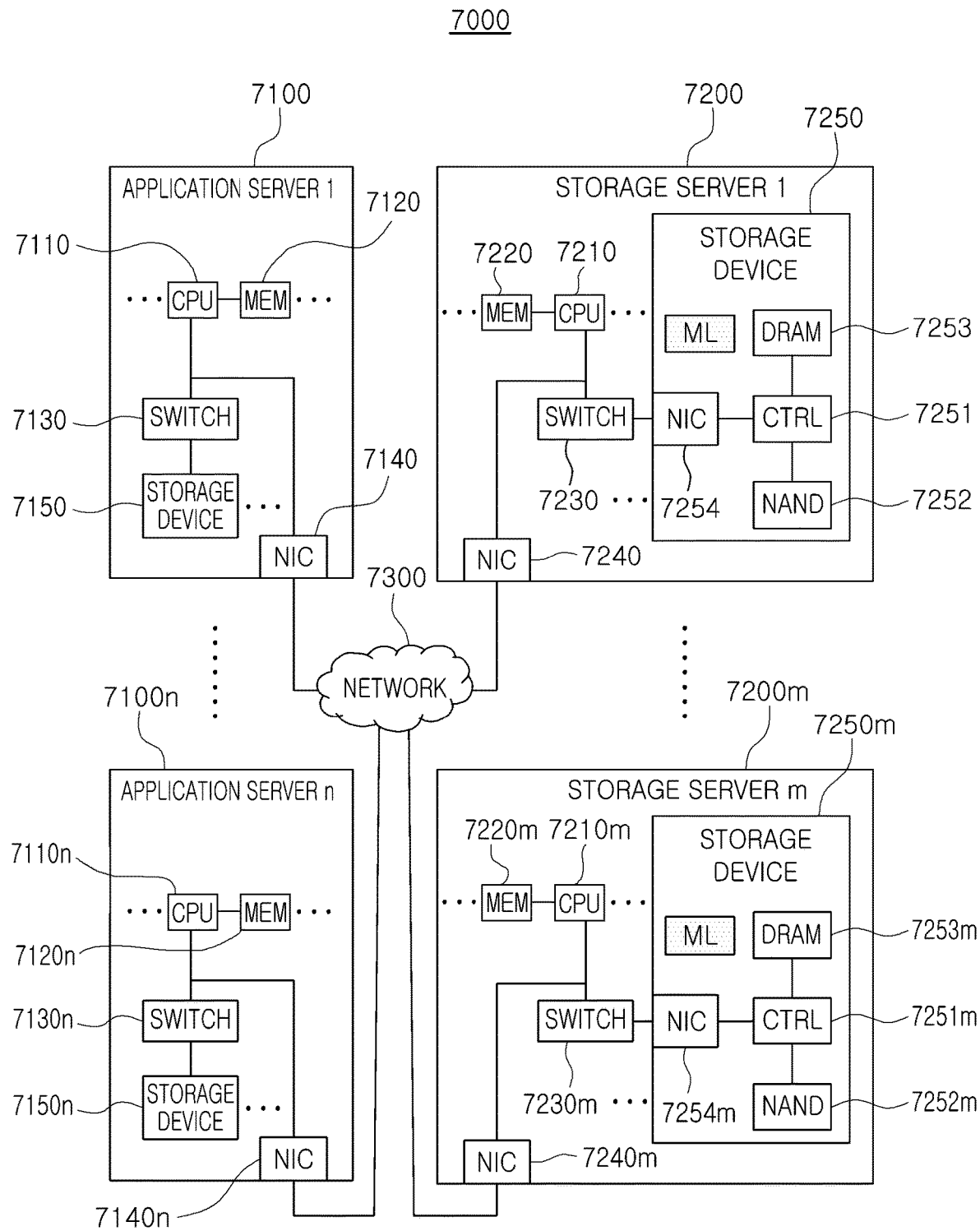
FIG. 11 is a diagram illustrating a data server system 7000 according to an example embodiment.

FIG. 11 is a diagram illustrating a data server system 7000 according to an example embodiment.

Referring to FIG. 11, the data server system 7000 may include application servers 7100 to 7100n and storage servers 7200 to 7200m. The number of application servers 7100 to 7100n and the number of storage be variously selected according to example embodiments, and the number of application servers 7100 to 7100n and the number of storage servers 7200 to 7200m) may be different from each other. The application server 7100 or the storage server 7200 may include at least one of processors 7110 and 7210 and memories 7120 and 7220.

Referring to the storage server 7200 as an example, the processor 7210 may control an overall operation of the storage server 7200 and access the memory 7220 to execute commands and/or data loaded in the memory 7220.

The memory 7220 may be a double data rate synchronous DRAM (DDR SDRAM), a high bandwidth memory (HBM), a hybrid memory cube (HMC), a dual in-line memory module (DIMM), an optane DIMM, or a non-volatile DIMM (NVMDIMM).

According to an example embodiment, the number of processors 7210 and the number of memories 7220 included in the storage server 7200 may be variously selected.

In an example embodiment, the processor 7210 and memory 7220 may provide a processor-memory pair. In an example embodiment, the number of the processor 7210 and the memory 7220 may be different from each other. The processor 7210 may include a single-core processor or a multi-core processor.

The above description of the storage server 7200 may be similarly applied to the application server 7100. According to an example embodiment, the application server 7100 may not include a storage device 7150. The storage server 7200 may include at least one storage device 7250. The storage device 7250 may be implemented to vary a signaling mode according to a channel environment. In addition, the storage device 7250 may be implemented to prevent the UE of a memory device (DRAM/NAND Flash/PRAM) as described in FIGS. 1 to 10.

The application servers 7100 to 7100*n* and the storage servers 7200 to 7200*m* may communicate with each other through a network 7300. The network 7300 may be realized using a fiber channel (FC) or Ethernet. Here, FC may be a medium used for relatively high-speed data transmission, and may include an optical switch that provides high performance/high availability. Depending on an access method of the network 7300, the storage servers 7200 to 7200*m* may be provided as a file storage, a block storage, or an object storage.

In an example embodiment, the network 7300 may be a storage-only network such as a storage area network (SAN). For example, the SAN may be an FC-SAN which uses an FC network and is realized according to an FC protocol (FCP). As another example, the SAN may be an IP-SAN which uses a TCP/IP network and is realized according to an iSCSI (SCSI over TCP/IP or Internet SCSI) protocol. In other example embodiments, the network 7300 may be a general network such as a TCP/IP network. For example, the network 7300 may be realized according to protocols such as FC over Ethernet (FCoE), network attached storage (NAS), NVMe over Fabrics (NVMe-oF), and the like.

Hereinafter, the application server 7100 and the storage server 7200 will be mainly described. The description of the application server 7100 may also be applied to other application servers 7100*n*, and the description of the storage server 7200 may also be applied to other storage servers 7200*m*.

The application server 7100 may store data, which is requested to be stored by the user or a client, in one of the storage servers 7200 to 7200*m* through the network 7300. In addition, the application server 7100 may acquire data, which is requested to be read by the user or the client, from one of the storage servers 7200 to 7200*m* through the network 7300. For example, the application server 7100 may be realized as a web server, a database management system (DBMS), or the like.

The application server 7100 may access a memory 7120*n* or a storage device 7150*n* included in another application server 7100*n* through the network 7300 or access the memories 7220 to 7220*m* or storage devices 7250 to 7250*m* included in the storage servers 7200 to 7200*m* through the network 7300. Accordingly, the application server 7100 may perform various operations on data stored on the application servers 7100 to 7100*n* and/or storage servers 7200 to 7200*m*. For example, the application server 7100 may execute a command to move or copy data between the application servers 7100 to 7100*n* and/or the storage servers 7200 to 7200*m*. In this case, the data may be moved directly from the storage devices 7250 to 7250*m* of the storage servers 7200 to 7200*m* to the memories 7120 to 7120*n* of the application servers 7100 to 7100*n* or via the memories 7220 to 7220*m* of the storage servers 7200 to 7200*m*. The data moved through the network 7300 may be encrypted data for security or privacy.

Referring to the storage server 7200 as an example, the interface 7254 may provide a physical connection between the processor 7210 and the controller 7251 and a physical connection between the NIC 7240 and the controller 7251. For example, the interface 7254 may be implemented by a direct attached storage (DAS) method that directly connects the storage device 7250 with a dedicated cable. In addition, referring to the storage server 7200 as an example, an interface (NIC) 7254 may provide a physical connection between the processor 7210 and a controller 7251 and a physical connection between an NIC 7240 and the controller 7251. For example, the interface 7254 may be realized by a direct attached storage (DAS) method that directly accesses the storage device 7250 by a dedicated cable. In addition, for example, the interface 7254 may be realized by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (e-MMC), universal flash storage (UFS), embedded universal flash storage (eUFS), compact flash (CF) card interface.

The storage server 7200 may further include a switch 7230 and a NIC 7240. The switch 7230 may selectively connect the processor 7210 and the storage device 7250 under the control of the processor 7210 or selectively connect the NIC 7240 and the storage device 7250.

In an example embodiment, the NIC 7240 may include a network interface card, a network adapter, and the like. The NIC 7240 may be connected to the network 7300 by a wired interface, a wireless interface, a Bluetooth interface, an optical interface, or the like. The NIC 7240 may include an internal memory, a DSP, a host bus interface, and the like and may be connected to the processor 7210 and/or the switch 7230 through the host bus interface. The host bus interface may be realized as one of the examples of the interface 7254 described above. In an example embodiment, the NIC 7240 may be incorporated with at least one of the processor 7210, the switch 7230, and the storage device 7250.

In the storage servers 7200 to 7200*m* or the application servers 7100 to 7100*n*, the processor may transmit a command to the storage devices 7130 to 7130*n* and 7250 to 7250*m* or the memories 7120 to 7120*n* and 7220 to 7220*m* to program data or read data. In this case, the data may be data error-corrected through an error correction code (ECC) engine. The data may be data which has undergone data bus inversion (DBI) or data masking (DM) and may include cyclic redundancy code (CRC) information. The data may be data encrypted for security or privacy.

The storage devices 7150 to 7150*m* and 7250 to 7250*m* may transmit a control signal and a command/address signal to the NAND flash memory device 7252-7252*m* in response to a read command received from the processor. Accordingly, when data is read from the NAND flash memory devices 7252 to 7252*m*, a read enable (RE) signal may be input as a data output control signal to serve to output data to a DQ bus. A data strobe (DQS) may be generated using the RE signal. The command and address signal may be latched to a page buffer according to a rising edge or a falling edge of a write enable (WE) signal.

The controller 7251 may control an overall operation of the storage device 7250. In an example embodiment, the controller 7251 may include a static random access memory (SRAM). The controller 7251 may write data into the NAND flash 7252 in response to a write command, or may read data from the NAND flash 7252 in response to a read command.

For example, the write command and/or read command may be provided from the processor 7210 in the storage server 7200, the processor 7210*m* in another storage server 7200*m*, or the processors 7110 to 7110*n* in the application servers 7100 to 7100*n*. A DRAM 7253 may temporarily store (buffer) the data written into the NAND flash 7252 or data read from the NAND flash 7252.

In addition, the DRAM 7253 may store metadata. Here, the metadata is user data or data generated by the controller 7251 to manage the NAND flash 7252. The storage device 7250 may include a secure element (SE) for security or privacy. In an example embodiment, the controller 7251 may include to perform machine learning (ML) in order to manage various operations of the memory device.

In the memory system using an error correction code (ECC) according to an example embodiment an ECC Decoding result (ECC Syndrome) may be used to count the number of occurrences of a codeword error (CE), and in connection therewith, a method of preventing the UE can be performed.

In an example embodiment, this UE prevention method can be applied inside or outside of a DRAM of an ECC method supporting the memory system.

In an example embodiment, the ECC Decoding result may include a Physical Address (Row/Column/Bank/Chip Address) and an Error Syndrome in which an error occurred in the memory.

In an example embodiment, the UE prevention method may store an Error Syndrome value, and record/store the number of 1s in the Syndrome.

In an example embodiment, when a new CE occurs, the UE prevention method may compare it with a previously stored Error Syndrome.

In an example embodiment, the UE prevention method may identify a weighted sum the number of CE occurrences based on a result of a syndrome analysis (a result of comparison with a previous Syndrome, a result of the number of 1).

In an example embodiment, the UE prevention method may predict the type and location of a fault in a memory using physical address (Row/Column/Bank/Chip) information about in which an error occurs in the memory.

In an example embodiment, when it is determined that the probability of occurrence of a UE is high (or when a CE Count exceeds a threshold value), the UE prevention method may repair the predicted fault region.

At least one of the controllers, correction circuits, counters, alert devices, encoders, decoders, registers, latches, buffers, generators, calculators, detectors, correctors, buffers, comparators, predictors or other element represented by a block as illustrated in FIGS. 1-4, 6, 7 and 9-11 may be embodied as various numbers of hardware, software and/or firmware structures that execute respective functions described above, according to an exemplary embodiment. For example, at least one of the controllers, correction circuits, counters, alert devices, encoders, decoders, registers, latches, buffers, generators, calculators, detectors, correctors, buffers, comparators, predictors or other element may use a direct circuit structure, such as a memory, a processor, a logic circuit, a look-up table, etc. that may execute the respective functions through controls of one or more microprocessors or other control apparatuses. Also, at least one of the controllers, correction circuits, counters, alert devices, encoders, decoders, registers, latches, buffers, generators, calculators, detectors, correctors, buffers, comparators, predictors or other element may be specifically embodied by a module, a program, or a part of code, which contains one or more executable instructions for performing specified logic functions, and executed by one or more microprocessors or other control apparatuses. Also, at least one of the controllers, correction circuits, counters, alert devices, encoders, decoders, registers, latches, buffers, generators, calculators, detectors, correctors, buffers, comparators, predictors or other element may further include or may be implemented by a processor such as a central processing unit (CPU) that performs the respective functions, a microprocessor, or the like. Two or more of the controllers, correction circuits, counters, alert devices, encoders, decoders, registers, latches, buffers, generators, calculators, detectors, correctors, buffers, comparators, predictors or other element may be combined into one single component, element, module or unit which performs all operations or functions of the combined two or more of controllers, correction circuits, counters, alert devices, encoders, decoders, registers, latches, buffers, generators, calculators, detectors, correctors, buffers, comparators, predictors or other element. Also, at least part of functions of at least one of the controllers, correction circuits, counters, alert devices, encoders, decoders, registers, latches, buffers, generators, calculators, detectors, correctors, buffers, comparators, predictors or other element may be performed by another of these components. Further, although a bus is not illustrated in each of the above block diagrams, communication between the components may be performed through the bus. Functional aspects of the above example embodiments may be implemented in algorithms that execute on one or more processors. Furthermore, the controllers, correction circuits, counters, alert devices, encoders, decoders, registers, latches, buffers, generators, calculators, detectors, correctors, buffers, comparators, predictors or other element represented by a block or processing steps may employ any number of related art techniques for electronics configuration, signal processing and/or control, data processing and the like.

As set forth above, according to an example embodiment, a controller, a memory system including the same, and an operating method thereof may prevent an uncorrectable error of a memory device by comparing a syndrome or an error address with those stored therein to generate a warning signal when a codeword error occurs.

While example embodiments have been shown and described above, it will be apparent to those skilled in the art that modifications and variations could be made without departing from the scope as defined by the appended claims.

What is claimed is:

1. An operating method of a memory system having a memory device and a controller, the operating method comprising:

obtaining a current syndrome corresponding to a codeword error that has occurred in the controller;
determining whether the current syndrome contains a single bit with a value of one;
determining whether the current syndrome matches a previous syndrome stored in a syndrome buffer, based on determining that the current syndrome contains the single bit with the value of one;
increasing a codeword error count value by an integer greater than one in the controller, based on determining that the current syndrome does not match the previous syndrome;
determining whether a second current syndrome matches the previous syndrome;
increasing the codeword error count value by one in the controller, based on determining that the second current syndrome matches the previous syndrome;
determining whether the codeword error count value is greater than a reference value; and
performing an operation for preventing an uncorrectable error of the memory device in the controller, based on determining that the codeword error count value is greater than the reference value.

2. The method of claim 1, further comprising:
determining whether a third current syndrome contains more than the single bit with the value of one; and
increasing the codeword error count value in the controller by one based on determining that the third current syndrome contains more than the single bit with the value of one.

3. The method of claim 1, further comprising:
determining whether a second codeword error count value is greater than the reference value; and
storing the second current syndrome in the syndrome buffer in the controller, based on determining that the second codeword error count value is not greater than the reference value.

4. The method of claim 1, further comprising storing an error address corresponding to the current syndrome in the controller.

5. The method of claim 4, further comprising comparing the stored error address with a previously stored error address.

6. The method of claim 5, further comprising, according to a result of the comparing, increasing any one or any combination of a first error count value corresponding to a row address, a second error count value corresponding to a column address, a third error count value corresponding to a bank address, and a fourth error count value corresponding to a chip address.

7. The method of claim 6, further comprising predicting a type or location of an error according to any one or any combination of the first error count value, the second error count value, the third error count value and the fourth error count value.

8. The method of claim 7, wherein the operation for preventing the uncorrectable error is performed according to the predicted type or location of the error.

9. The method of claim 1, wherein the preventing the uncorrectable error comprises any one or any combination of a sparing operation, a page-offline operation, a map-out operation, or a repair operation.

10. A memory system, comprising:
at least one memory device; and
a controller configured to control the at least one memory device, wherein the controller comprises:
an error correction circuit configured to correct an error in data read from the at least one memory device;
a codeword error counter configured to obtain a syndrome of a current codeword error, based on a codeword error occurring in the error correction circuit, and to obtain a weighted codeword error count value by comparing the obtained syndrome with a previous syndrome; and
an alert device configured to generate a warning signal for preventing an uncorrectable error of the at least one memory device according to the weighted codeword error count value,
wherein the codeword error counter is further configured to identify one as the weighted codeword error count value based on the obtained syndrome matching the previous syndrome, and an integer greater than one as the weighted codeword error count value based on the obtained syndrome not matching the previous syndrome.

11. The memory system of claim 10, wherein the codeword error counter comprises
a syndrome obtainer configured to obtain the syndrome of the current codeword error;
a syndrome buffer configured to store the previous syndrome;
a counter configured to increase a count value by one based on the syndrome of the current codeword error;
a comparator configured to compare the obtained syndrome with the previous syndrome stored in the syndrome buffer; and
a weighted codeword error counter configured to generate the weighted codeword error count value according to an output value of the counter and an output value of the comparator.

12. The memory system of claim 10, wherein the controller further comprises an error counter configured to generate an error address count value by comparing a current error address with a previous error address corresponding to the codeword error, based on the codeword error occurring in the error correction circuit.

13. The memory system of claim 12, wherein the error counter comprises
a previous error address register configured to store the previous error address;
a current error address register configured to store the current error address;
a comparator configured to compare the previous error address with the current error address; and
an error address counter configured to increase the error address count value according to an output of the comparator.

14. The memory system of claim 13, wherein the error address counter comprises,
a row counter configured to increase a row address count value by one, based on the output of the comparator indicating row addresses of the previous error address correspond to the current error address, and to output the row address count value as the error address count value;
a column counter configured to increase a column address count value by one, based on the output of the comparator indicating column addresses of the previous error address correspond to the current error address, and to output the error address count value as the column address count value;
a bank counter configured to increase a bank address count value by one, based on the output of the comparator indicating bank addresses of the previous error address correspond to the current error address, and to output the error address count value as the bank address count value; and a chip counter configured to increase a chip address count value by one, based on the output of the comparator indicating chip addresses of the previous error address correspond to the current error address, and to output the error address count value as the chip address count value.

15. The memory system of claim 14, further comprising a fault predictor configured to predict a type or location of the error based on the error address count value of the error address counter.

16. The memory system of claim 15, wherein the fault predictor is further configured to predict a row error based on the row address count value being greater than one, and predict a column error based on the column address count value being greater than one.

17. The memory system of claim 15, wherein the fault predictor is further configured to predict a single bank error, based on the row address count value being greater than one, and the column address count value being greater than one.

18. The memory system of claim 17, wherein the fault predictor is further configured to predict a multi-bank error based on the bank address count value being greater than one, and predict a multi-chip error based on the chip address count value being greater than one.

19. A controller comprising:

an error correction circuit configured to correct an error in data read from a memory device;

a first error counter configured to provide a syndrome of a codeword error based on the codeword error occurring in the error correction circuit, and to compare the provided syndrome with a previous syndrome to generate a first error count value;

a second error counter configured to compare an error address of the codeword error with a previously stored error address based on the codeword error occurring in the error correction circuit to generate a second error count value;

a fault predictor configured to predict a type or location of the error according to the second error count value; and an alert device configured to output a warning signal to the memory device, based on the first error count value being greater than a reference value, and to output the warning signal according to an output of the fault predictor, wherein the first error counter is further configured to increase the first error count value by one based on the provided syndrome matching the previous syndrome, and increase the first error count value by an integer greater than one based on the provided syndrome not matching the previous syndrome.

* * * * *